US012791597B2

(12) United States Patent
Bunting et al.

(10) Patent No.: US 12,791,597 B2
(45) Date of Patent: Nov. 10, 2026

(54) DETECTING ELECTRICAL DEGRADATION WITHIN A CIRCUIT

(71) Applicant: THE BOEING COMPANY, Arlington, VA (US)

(72) Inventors: Michael J. Bunting, Mount Pleasant, SC (US); Dean A. Nguyen, Yorba Linda, CA (US)

(73) Assignee: The Boeing Company, Arlington, VA (US)

( * ) Notice: Subject to any disclaimer, the term of this patent is extended or adjusted under 35 U.S.C. 154(b) by 225 days.

(21) Appl. No.: 18/780,105

(22) Filed: Jul. 22, 2024

(65) Prior Publication Data

US 2026/0023104 A1 Jan. 22, 2026

(51) Int. Cl.
*G01R 31/00* (2006.01)

(52) U.S. Cl.
CPC .................................. *G01R 31/008* (2013.01)

(58) Field of Classification Search
CPC ............ G01R 31/008; G03F 7/30; G03F 7/40
USPC .......................................................... 324/503
See application file for complete search history.

(56) References Cited

U.S. PATENT DOCUMENTS

2002/0036504 A1 * 3/2002 Troy .................... G01R 31/389 324/430
2004/0100266 A1 * 5/2004 Liebermann ......... G01R 31/389 324/426
2004/0207365 A1 * 10/2004 Jones ................. G01R 31/3646 320/132
2005/0262364 A1 * 11/2005 Diab ....................... H04M 9/08 713/300
2006/0244423 A1 * 11/2006 Henningson ......... G01R 31/386 320/150
2009/0140748 A1 * 6/2009 Lindsey ................. G01R 31/50 324/538
2014/0077830 A1 * 3/2014 Veselic .................. G01R 31/50 324/750.01
2021/0005410 A1 * 1/2021 Nguyen .................. B60L 1/003
2023/0187922 A1 * 6/2023 Randazzo .............. H02H 5/048 361/87
2023/0377780 A1 * 11/2023 Chen ...................... H01C 7/027

* cited by examiner

*Primary Examiner* — Raul J Rios Russo

(74) *Attorney, Agent, or Firm* — Joseph M. Butscher; Carroll, Hoette & Butscher, LLC

(57) ABSTRACT

Techniques for identifying a fault in a circuit. These techniques include measuring at least one of a first voltage drop or a first resistance, across a first circuit, using a load tester providing a first load greater than zero, and measuring at least one of a second voltage drop or a second resistance, across the first circuit, using the load tester providing no load. The techniques further include determining that at least one of: (i) a difference between the first voltage drop and the second voltage drop, or (ii) a difference between the first resistance and the second resistance, exceeds a pre-determined threshold value, and, based on the determining, identifying a fault in the first circuit.

20 Claims, 7 Drawing Sheets

DETECTING ELECTRICAL DEGRADATION WITHIN A CIRCUIT

FIELD

Aspects of the present disclosure relate to fault detection for an electrical circuit.

BACKGROUND

Vehicles, such as aircraft, include thousands of electrical connections and components, and miles of interface wiring, all of which are subject to extreme vibration and environmental changes during normal operation. Degraded component connections and their interface wiring typically pass conventional ground tests when the operational stressors are removed. Attempting to induce environmental conditions piecemeal (e.g., shaking wiring harnesses, taxiing the airplane, and pressurizing), typically result in extended out of service time and an inability to duplicate the failure.

SUMMARY

Embodiments include a method. The method includes measuring at least one of a first voltage drop or a first resistance, across a first circuit, using a load tester providing a first load greater than zero and measuring at least one of a second voltage drop or a second resistance, across the first circuit, using the load tester providing no load. The method further includes determining that at least one of: (i) a difference between the first voltage drop and the second voltage drop, or (ii) a difference between the first resistance and the second resistance, exceeds a pre-determined threshold value, and, based on the determining, identifying a fault in the first circuit.

Embodiments further include any embodiment disclosed herein, wherein the first load is greater than 1 mA and less than 1 A.

Embodiments further include any embodiment disclosed herein, wherein the pre-determined threshold value comprises a relative percent change between at least one of: (i) the difference between the first voltage drop and the second voltage drop, or (ii) the difference between the first resistance and the second resistance.

Embodiments further include any embodiment disclosed herein, wherein the relative percent change comprises a relative percent change between 0% and 25%.

Embodiments further include any embodiment disclosed herein, wherein the load tester comprises a resistor in series with a positive temperature coefficient (PTC) thermistor.

Embodiments further include any embodiment disclosed herein, wherein the load tester is capable of providing the first load for a plurality of voltages, and wherein each of the plurality of voltages is associated with a respective path in the load tester comprising a resistor in series with a PTC thermistor.

Embodiments further include any embodiment disclosed herein, wherein the load tester is integrated into a multimeter device.

Embodiments further include any embodiment disclosed herein, further including identifying a component of the circuit causing the fault using a time domain reflectometer (TDR).

Embodiments further include any embodiment disclosed herein, further including providing a stable resistance to the circuit using a resistance stabilizer.

Embodiments further include any embodiment disclosed herein, wherein the resistance stabilizer comprises a resistor in series with a PTC thermistor.

Embodiments further include a load tester device, including an input for a circuit under test, a load selector configured to switch between providing a load and providing no load to the circuit under test, an output for measuring at least one of: (i) a voltage drop across the circuit under test or (ii) a resistance across the circuit under test, and a resistor in series with a positive temperature coefficient (PTC) thermistor. The load tester device is configured to measure both (i) the voltage drop across the circuit under test or (ii) the resistance across the circuit under test both when providing a first load to the circuit under test and when providing no load to the circuit under test, using a circuit path including the resistor in series with the PTC thermistor.

Embodiments further include any embodiment disclosed herein, wherein the load tester is capable of providing the first load for a plurality of voltages, and wherein each of the plurality of voltages is associated with a respective path in the load tester comprising a resistor in series with a PTC thermistor.

Embodiments further include any embodiment disclosed herein, wherein the load tester device is integrated into a multimeter device.

Embodiments further include any embodiment disclosed herein, wherein the load tester device further includes a second circuit path providing a stable resistance to the circuit under test, using a resistance stabilizer.

Embodiments further include any embodiment disclosed herein, wherein the second circuit path providing the stable resistance to the circuit under test comprises a second resistor in series with a second one or more PTC thermistors.

Embodiments further include a method. The method includes applying a stable signal to a circuit under test and providing a stable resistance to the circuit under test using a resistance stabilizer. The method further includes identifying a fault in the circuit under test, including: determining that at least one of: (i) a difference between a first voltage drop for the circuit under test, measured using a load tester, and a second voltage drop for the circuit under test, measured using the load tester, or (ii) a difference between a first resistance for the circuit under test, measured using the load tester, and a second resistance for the circuit under test measured, using the load tester, exceeds a pre-determined threshold value.

BRIEF DESCRIPTION OF THE DRAWINGS

So that the manner in which the above recited features can be understood in detail, a more particular description, briefly summarized above, may be had by reference to example aspects, some of which are illustrated in the appended drawings.

DETAILED DESCRIPTION

Figure 1:
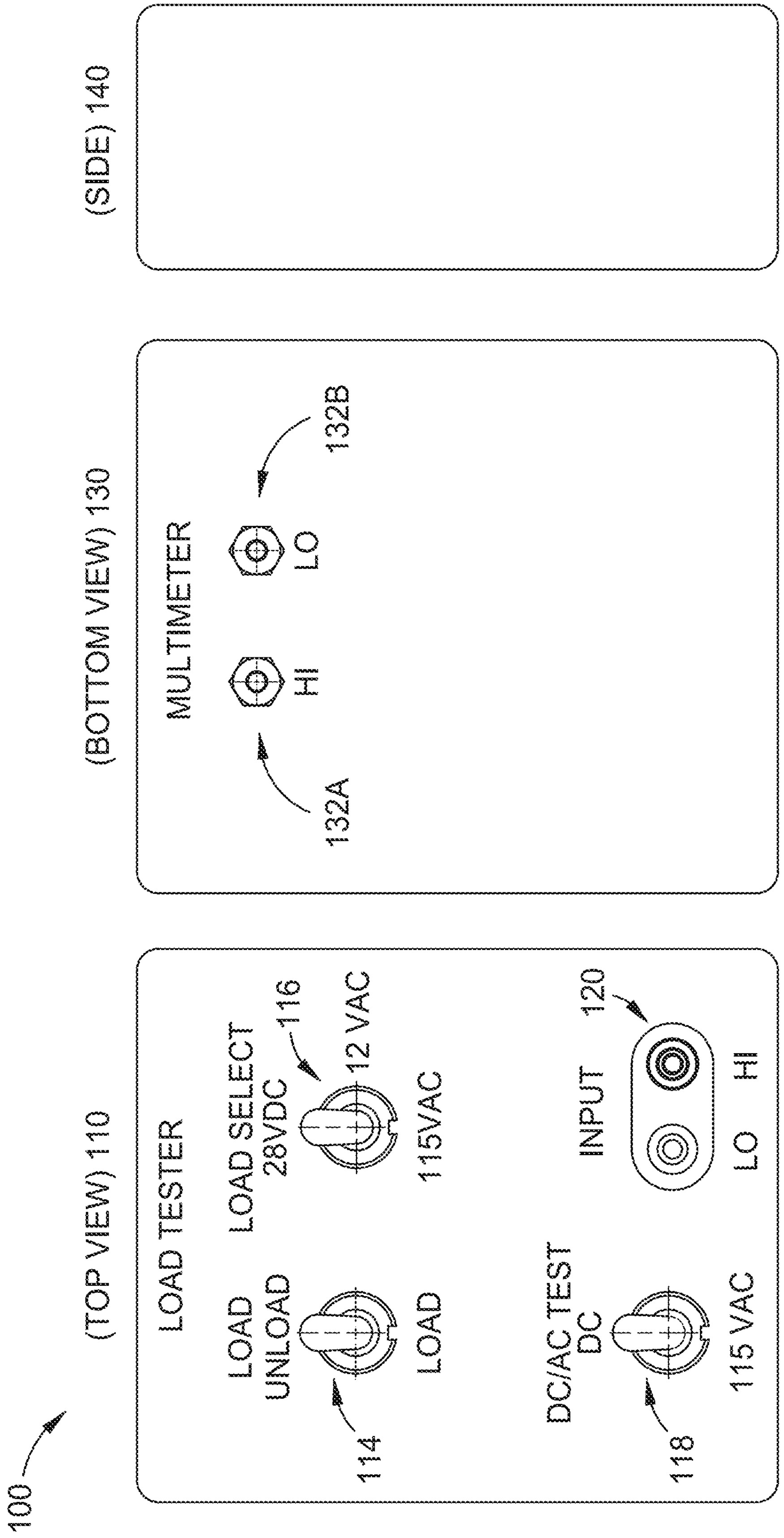
FIG. 1 depicts an example interface for a load tester, according to at least one aspect.

As discussed above, detecting degraded electrical components and connections (e.g., in a vehicle) is a very challenging problem. Current methods of testing for degraded electrical components and connections typically use high-impedance (e.g., digital) test equipment for voltage and resistance measurements, which ensures safety and prevents damage to sensitive equipment. Due to the equipment's extremely high-impedance (e.g., on the order of 1 MΩ to 10 MΩ) even severe degradation of circuit components and interface wiring are not detected (e.g., due to the voltage drop ratio of standard multimeters). For example, a non-resettable "hard" fault of 400 ohms would not detected by use of high-impedance testers (e.g., using 30V and 10 MΩ). In this example, 30V/(10 MΩ+400Ω)=2.9999 mA, which will cause a standard multimeter to display 29.9988V due to a loss of only 0.0012V across the 400Ω resistance. A 1 mV drop would not only be undetected, it would also likely be considered a normal drop due to the interconnected wiring or meter leads.

Low-impedance equipment (e.g. a load lamp or older analog multimeter) does not solve these issues, because it may permanently damage sensitive vehicle components (e.g., computers) when testing their output. Low-impedance equipment may also be hazardous to personnel, when exceeding design operational ampacity. Additionally, traditional use of low-impedance equipment on non-sensitive devices (e.g., splices, connectors, wiring) are subjective, relying on the operator to notice a dimmer than normal lamp or slight change in needle variation, and must rely on duplication of most environmental conditions. For example, using existing low-impedance techniques a technician might shake a wiring harness, in order to severely dim a load lamp or sufficiently change an analog meter needle display.

Modern technical manuals typically instruct users to disconnect electrical connectors and test for voltage or resistance using a high-impedance digital multimeter. But the vast majority of the time, this technique will not detect electrical degradation (e.g., a degraded contact, loose or corroded connection, poor crimp/splice, broken wiring strands, or any other suitable degradation), unless the component is completely in-operational during testing. This is because unless the wiring is completely open or shorted, the voltage or resistance will measure within limits when operational conditions are not present (e.g., when the vehicle is not undergoing operational conditions).

When voltage and resistance checks are normal, technicians are typically directed to sequentially replace components, and then re-try the equipment (e.g., re-fly the airplane). When the problem repeats, the technicians continue replacing components until the fault (e.g., vehicle fault) no longer repeats. Therefore, to prevent repeat inflight failures, lacking clear objective test methodology, technicians are often directed to replace multiple system components based on arbitrary and anecdotal information. Lacking root cause identification, systemic problems remain uncovered. Vehicles continue to operate intermittently, delaying operations and skewing reliability data. Easy to change components are often indicated for design change, under an assumption of failure due to inadequate troubleshooting procedures, lacking a true technical evaluation.

Additionally, current fault isolation procedures sometimes direct technicians to use low-impedance inductive devices, such as load lights, to test low current discrete switches. While testing control switches using load lights at full voltage and amperages of 500 mA are acceptable for higher amperage devices (e.g., solenoids, motors, or other suitable higher amperage devices) this leads to reliability issues when used on discrete switching circuits of only 2-10 mA. Lab testing demonstrates that using >12V and 500 mA, especially inductive loads, lead to arcing and pitting. Again, while this may be suitable for heavier amperage components, this continues to lead to intermittent operation when used on low current devices which cannot provide consistent low amperage connections on a single-pitted surface.

One or more techniques below are directed to a load tester device for detecting electrical degradation of one of more connections (e.g., within a vehicle or any other suitable electrical system). In an aspect, the device is engineered to automatically limit current draw to ensure operator safety and component safety (e.g., vehicle component safety). For example, a positive temperature coefficient (PTC) thermistor can act as a resettable fuse, withstanding up to 1000V making the unit safe (e.g., category four (CAT IV)) for the user and the equipment. If exceeded, the device opens the circuit, preventing harm or damage, and automatically resets once the incorrect power is removed.

In an aspect, a load tester device with one or more of the described features can be used to detect degraded contacts, loose or corroded connections, poor crimps or splices, broken wiring strands, or any other suitable problems. In an aspect, this is done by determining if an amount of voltage drop or resistance is above a pre-determined threshold, and analyzing voltage drop and resistance by comparing to a fixed resistance, using a suitable load tester. In an aspect, use of these techniques ensures safe operation and significantly reduces (or eliminates) any possibility of damage to vehicle component and wiring. It can also remove the necessity to re-create environmental conditions, including shaking, vibration, temperature or pressure changes, or any other suitable environmental conditions.

Further, a load tester device with one or more of the described features can be used to determine the state of resistance in a circuit, or in individual connections, or specific sections of interconnected wiring, or internal to vehicle components. For example, a load tester device can detect when an amount of voltage drop is greater than a relative percentage (e.g., a 1% difference) when comparing an unloaded circuit (e.g., an open circuit with a connector removed) to the load tester device's load (e.g., 10 mA). Using one or more techniques described below, the output of even sensitive computers may be load tested without fear of damaging the internal hardware. Poor internal connections (e.g., solder joints, crimps, pin socket wear, degraded board level components, and any other suitable problems) may be uncovered by using a suitable device in the field.

In another aspect, a suitable resistance-stabilizer device can be used with a stable output (e.g., a 10 mA stable signal output) to provide a fixed current limiting resistance of 500 mΩ. The resistance-stabilizer device can provide a stable resistance reference (e.g., above a vehicle's electro-magnetic-interference (EMI) noise floor), to uncover electrical degradation of contacts (e.g., switches, relays, connectors, or any other suitable contacts) and their interface wiring. This can be done regardless of wiring length or whether the equipment is tested outside of the operating system (e.g., outside of the vehicle). For example, when an individual limit switch contact or wire shorter than 10 meters or 32 feet of standard vehicle copper wiring is tested using this relative percent method, the measurement may fluctuate wildly with a 20 REL % deviation. When adding the equivalent resistance of 10 meters of vehicle copper wiring, 500 mΩ, the measurement is now stable with less than 1 REL % deviation.

In an aspect, the resistance-stabilizer device is also engineered to automatically limit current draw to ensure operator safety, as well as component (e.g., vehicle component) and device (e.g., testing device) protection if inadvertently connected to an energized circuit. A PTC thermistor acts as a resettable fuse, withstanding up to 1000V making the unit CAT IV safe for the user and the equipment. If exceeded, the device opens the circuit, preventing harm or damage, and automatically resets once the power is removed. The device can include current limiting resistors (e.g., PTC thermistors), and a selector switch.

In an aspect, one or more of these techniques can be used to determine the exact location of a fault when the amount of voltage drop or resistance exceeds a pre-determined threshold. For example, if a voltage drop, or resistance, results in greater than a relative percentage of difference (e.g., greater than a 1% difference), when comparing an unloaded circuit to device's load (e.g., a 10 mA load), a time domain reflectometer (TDR) may be used to detect a deviation greater than a threshold value (e.g., greater than 10 mρ). Further, a masking TDR can be used to create and save baselines for healthy circuits. For example, a pre-determined threshold can be used (e.g., a greater than 10 mρ exceedance) to trigger a user alert that an anomaly is present. The user may then easily identify the exact location of the 10 mρ exceedance, where the saved baseline and the live trace deviate more than 10 mρ.

FIG. 1 depicts an example interface for a load tester 100, according to at least one aspect. A top view 110 depicts a top view of the load tester 100. In an aspect the top view 110 illustrates a load switch 114 (e.g., switch between a loaded mode and an unloaded mode). The top view 110 further illustrates a load select switch 116. In an aspect, the load select switch 116 can switch between multiple loads (e.g., a 115 AC 50/60/400 Hz load, a 12V DC load, and a 28V DC load). These are merely examples, and the load select switch 116 can switch been any suitable number of loads, and any suitable loads (e.g., any suitable AC or DC loads).

In an aspect, the top view 110 further illustrates a DC/AC test switch 118. For example, the DC/AC test switch 118 can switch between a DC and an AC (e.g., a 115V AC) test. These are, again, merely examples and the DC/AC test switch 118 can switch between any suitable DC and AC tests. The top view 110 further illustrates an input 120 (e.g., a low input and a high input). For example, the input 120 can be used to provide input from device under test (e.g., using a suitable connection type).

In an aspect, a bottom view 130 depicts a bottom view of the load tester 100. The bottom view 130 illustrates multimeter interfaces 132A (e.g., a high interface) and 132B (e.g., a low interface). For example, the load tester can connect to a multimeter using a suitable connection type (e.g., one or more banana plugs or any other suitable connection type. Further, a side view 140 depicts a side view of the load tester 100.

In one aspect, the load tester 100 is a stand-alone tool or device. For example, as illustrated the load tester 100 can have top view dimensions on the order of a few inches (e.g., 3 inches×3 inches) and somewhat smaller side dimensions (e.g., 2 inches). This is merely an example, and the load tester 100 can have any suitable size or dimensions. Further, the switches 114, 116, and 118, input 120, and multimeter interfaces 132A-B are merely examples. The load tester 100 can have any suitable number of combination of switches and interfaces, and these switches and interfaces can be located on any suitable surface of the load tester 100.

Alternatively, or in addition, the load tester 100 may be engineered internal to handheld tools (e.g., integrated into a multimeter device), onboard vehicle components, or any other suitable device or component, as hardware or software. For example, the aspects discussed below in relation to FIGS. 2-3 can be engineered internal to a suitable device or component, to alert a user of possible electrical degradation (e.g., integrated into a multimeter device).

Figure 2:
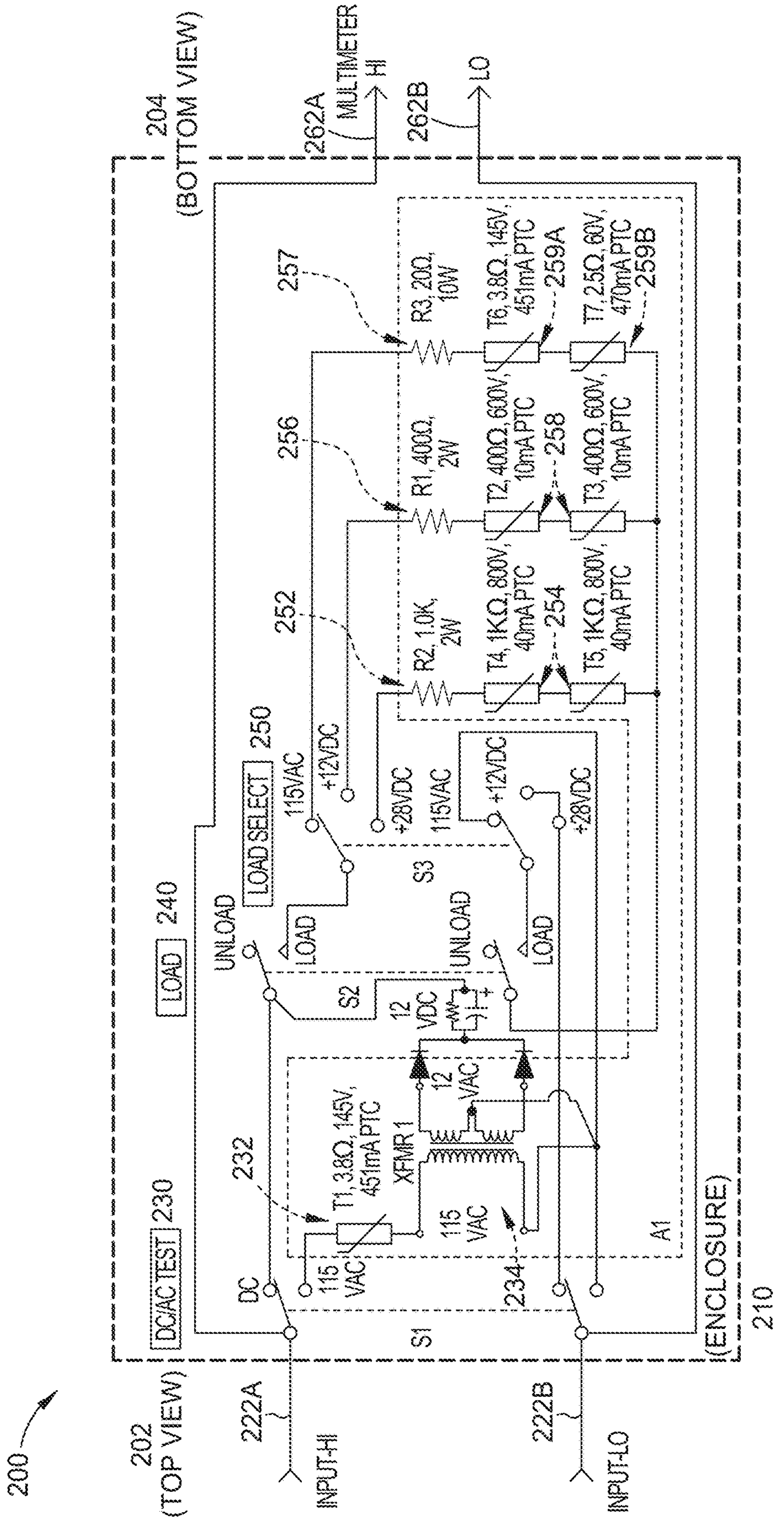
FIG. 2 depicts a schematic for an example load tester, according to at least one aspect.

FIG. 2 depicts a schematic 200 for an example load tester, according to at least one aspect. In an aspect, the schematic 200 corresponds to the load tester 100 illustrated in FIG. 1. The load tester includes a PTC thermistor that acts as a resettable fuse (e.g., withstanding up to 1000V) making the unit safe for the user and the equipment (e.g., CAT IV safe). For example, a resistor and PTC thermistors are soldered on a printed circuit board (PCB) in series, but parallel across the inputs (e.g., across input banana jacks). This places a load (e.g., a 10 mA load) across the positive and negative terminals of the meter. If voltage levels are exceeded, the PTC will immediately open, protecting the user, device and tested equipment from exceeding the maximum (e.g., 10 mA). In an aspect, a switch allows the user to easily load and unload the load (e.g., the 10 mA load) across the positive and negative terminals: 115 VAC 50/60/400 Hz AC, 12 VDC, and 28 VDC. As discussed further, below, in relation to FIG. 3, the user compares the unloaded (open circuit voltage) to the device load (10 mA) and ensures a sufficiently small deviation (e.g., <1 REL %).

In an aspect, the schematic 200 illustrates a top view 202 and a bottom view 204 of one implementation of such a load tester. For example, the schematic 200 illustrates an enclosure 210 (e.g., a plastic body). The schematic 200 further illustrates two inputs: a high input 222A and a low input 222B (e.g., corresponding to the input 120 illustrated in FIG. 1). A DC/AC test switch 230 (e.g., corresponding to the DC/AC test switch 118 illustrated in FIG. 1) allows a user to switch between DC and AC testing. For example, the switches S1 operate to switch between DC and AC testing. One or more thermistors 232 (e.g., one or more T1, 145V, 3.80, 145 MA thermistors) are coupled to transformers 234 (e.g., a 115V AC transformer and 12V AC transformer and full wave rectification) to facilitate the switch between DC and AC load testing.

A load switch 240 (e.g., corresponding to the load switch 114 illustrated in FIG. 1) allows a user to switch between an unloaded and a loaded mode. As illustrated, in an unloaded mode a switch S2 operates to open the circuit, or provide a load, as desired by the user.

A load select switch 250 (e.g., corresponding to the load select switch 116 illustrated in FIG. 1) allows the user to select between loads. For example, in the illustrated aspect a user can select between a 115 AC load, a 12V DC load, or a 28V DC load. For the 28V DC load, a resistor 252 is connected in series with one or more thermistors 254 (e.g., T4, 1K, PTC thermistors). For the 12V DC load, a resistor 256 is connected in series with one or more thermistors 258 (e.g., T2, 400Ω, PTC thermistors). For the 115V AC load, a resistor 257 is connected in series with one thermistor 259A (e.g., T6, 3.8Ω, PTC thermistor) and another thermistor 259B (e.g., T7, 2.5Ω, PTC thermistor).

Multimeter connection 262A (e.g., a high multimeter connection) and 262B (e.g., a low multimeter connection)

provide for connection to a multimeter or another suitable tool or component (e.g., correspond to the multimeter connections 132A and 132B illustrated in FIG. 1). As discussed above, the respective resistor and PTC thermistor combinations (e.g., the resistor 252 with the thermistor(s) 254 and the resistor 256 with the thermistor(s) 258) are soldered on a PCB in series, but parallel across the inputs (e.g., across the inputs 222A and 222B). This places a load (e.g., a 10 mA load) across the positive and negative terminals of the meter. If voltage levels, current levels, or both levels are exceeded, the PTC will immediately open, protecting the user, device and tested equipment from exceeding the maximum (e.g., 10 mA).

Figure 3:
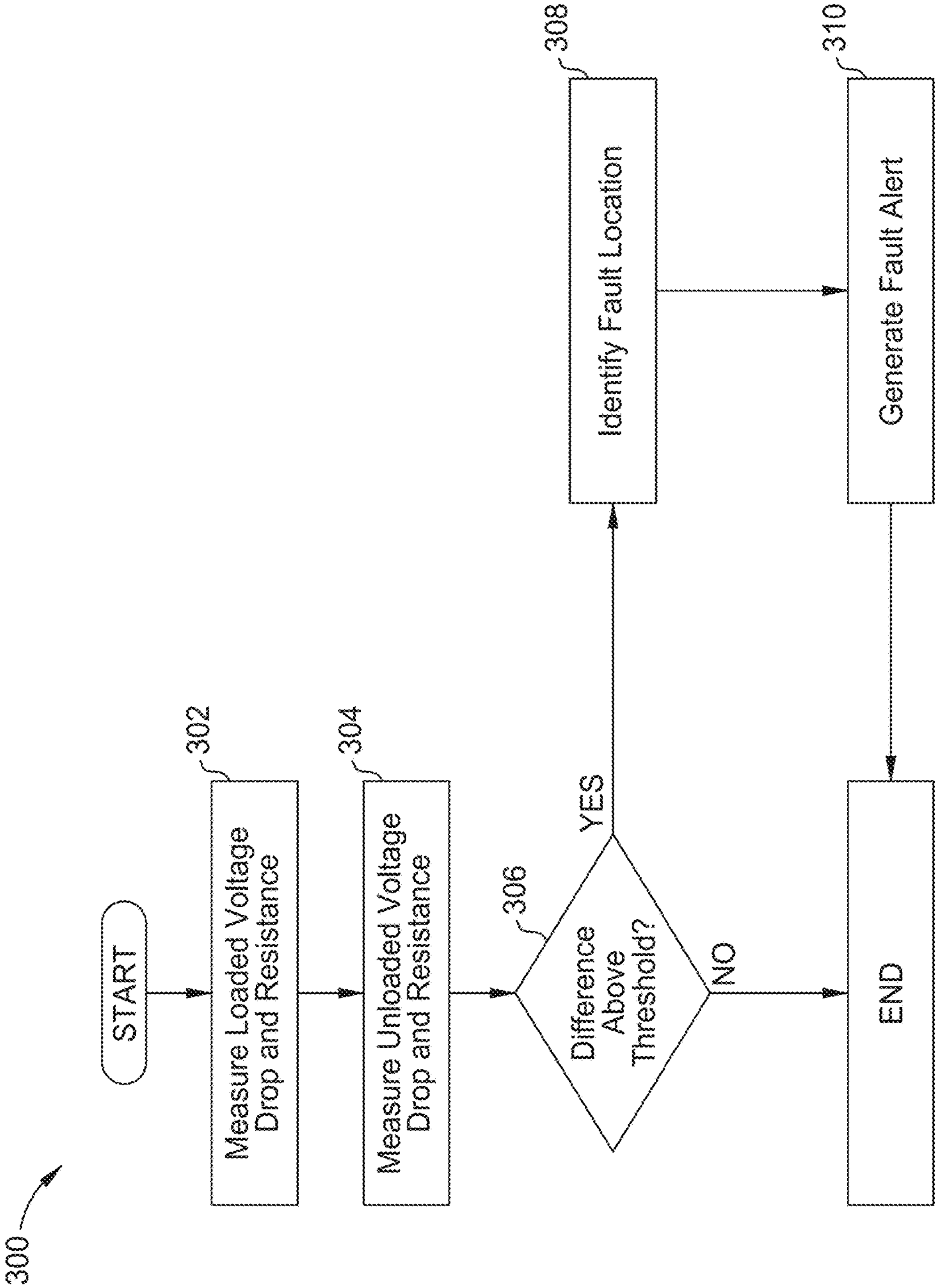
FIG. 3 depicts a flowchart illustrating identifying electrical degradation using a load tester, according to at least one aspect.

FIG. 3 depicts a flowchart 300 illustrating identifying electrical degradation using a load tester, according to at least one aspect. At block 302 a load tester (e.g., the load tester 100 illustrated in FIG. 1 with a schematic 200 as illustrated in FIG. 2) measures a voltage drop and resistance in a circuit, with a load applied. For example, the load tester can be connected to a circuit under test, and a user, an automated software service (e.g., the testing service 712 illustrated in FIG. 7), or any other suitable entity, can apply a small load (e.g., a 10 mA load) to measure a voltage drop and resistance across the circuit. In an embodiment, 10 mA is merely one example (e.g., for load testing relating to aviation or industrial signaling equipment that uses a 10 mA load). Any suitable load can be used, including a range between 1 mA to 1A, depending on the equipment being tested.

Using the schematic 200 illustrated in FIG. 2 as an example, the circuit under test can be connected to the inputs 222A-B. A user can select to operate with a load (e.g., using the load switch 240), can select the load (e.g., using the load select switch 250), and can select DC or AC testing (e.g., using the DC/AC test switch 230). A user can connect a multimeter, or another suitable device or component, to the multimeter outputs 262A-B, and the load tester can be used to measure the drop in voltage and resistance across the circuit.

At block 304, the load tester measures a voltage drop and resistance in a circuit, with no load applied (e.g., using an open load tester). For example, the load tester can be connected to a circuit under test, and can apply no load to measure a voltage drop and resistance across the circuit.

Using the schematic 200 illustrated in FIG. 2 as an example, the circuit under test can be connected to the inputs 222A-B. A user can select to operate unloaded (e.g., using the load switch 240), and can connect a multimeter, or another suitable device or component, to the multimeter outputs 262A-B. The load tester can be used to measure the drop in voltage and resistance across the circuit, in unloaded mode.

In an aspect, as discussed above in relation to FIG. 2, the load tester is engineered to automatically limit current draw to no greater than 10 mA for the most common voltages. This ensures operator safety, and protection of both the device under test and the testing devices. For example, one or more PCT thermistors act as a resettable fuses, withstanding up to 1000V making the unit safe (e.g., CAT IV safe for the user and the equipment. If exceeded, the load tester opens the circuit, preventing harm or damage, and automatically resets once the incorrect power is removed.

At block 306, the load tester is used to determine whether the differences in voltage drop, resistance, or both, exceed a threshold value. For example, the load tester can be used to compare the unloaded (e.g., open) voltage drop or resistance, measured at block 304, with the loaded (e.g., using a 10 mA load) voltage drop or resistance measured at block 302. If the voltage drop, resistance, or both, exceed a threshold value, that indicates a fault, and the flow proceeds to block 308. If not, the flow ends.

In an aspect, the threshold value is pre-determined. For example, the load tester can be used to identify a 1% relative deviation between the loaded and unloaded measurements. Further examples may be instructive. Assume a voltage drop of 115V is measured at 304 (e.g., unloaded), and a voltage drop of 113.8V is measured at 302 (e.g., using a 10 mA load in the load tester). The relative values can be measured using a formula:

$$\frac{(V_2 - V_1)}{|V_1|} * 100.$$

Plugging in the values:

$$\frac{(113.8 - 115)}{115} * 100 = \frac{-1.2}{115} * 100 =$$
$$-0.0104348 * 100 = -1.04348\% \text{ change} = \text{a decrease of } 1.034348\%.$$

Assuming the threshold is a 1% relative deviation, this is greater than a 1% decrease and so a fault is indicated and the flow proceeds to block 308.

In an aspect, a threshold of 1% relative deviation is likely to be suitable for many circumstances, including for airplanes or other vehicles. But this is merely an example, and any suitable threshold can be used. Further, in an aspect the threshold can be a hyper-parameter configured by a user (e.g., using a suitable user interface). For example, a threshold between 0% relative deviation and 25% relative deviation can be used. In an embodiment, a range between 0% and 25% relative deviation may be suitable for current and voltage phase sampling that is 10% volt and 20% amp.

At block 308, the load tester is used to identify a fault location. For example, a TDR may be used to detect a deviation greater than a threshold value (e.g., greater than 10 mρ). Further, a masking TDR can be used to create and save baselines for healthy circuits. For example, a pre-determined threshold can be used (e.g., a greater than 10 mρ exceedance) to trigger a user alert that an anomaly is present. The user may then easily identify the exact location of the 10 mρ exceedance, where the saved baseline and the live trace deviate more than 10 mρ.

At block 310, the load tester is used to generate a fault alert. In an aspect, the load tester is used to generate an automated fault alert (e.g., using a suitable visual or auditory user interface). This could include a visual message, an audio indicator, an electronic indicator (e.g., an SMS message, e-mail message, or any other suitable electronic message).

Figure 4:
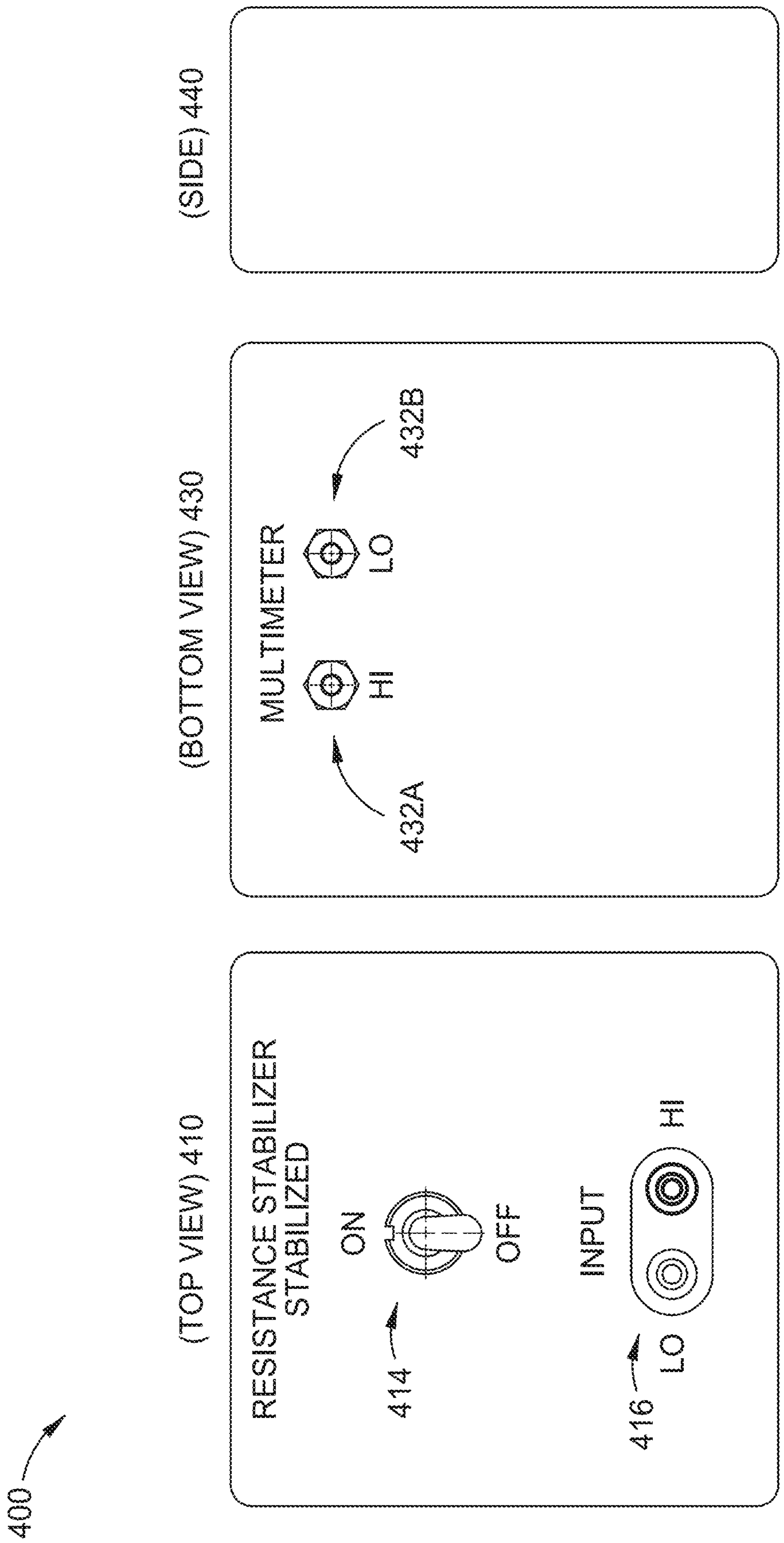
FIG. 4 depicts an example interface for a resistance stabilizer, according to at least one aspect.

FIG. 4 depicts an example interface for a resistance stabilizer 400, according to at least one aspect. A top view 410 depicts a top view of the resistance stabilizer 400. In an aspect the top view 410 illustrates an on-off switch 114. The top view 410 further illustrates an input 416 (e.g., a low input and a high input). For example, the input 416 can be used to provide input from device under test (e.g., using a suitable connection type).

In an aspect, a bottom view 430 depicts a bottom view of the resistance stabilizer 400. The bottom view 430 illustrates multimeter interfaces 432A (e.g., a high interface) and 432B (e.g., a low interface). For example, the resistance stabilizer can connect to a multimeter using a suitable connection type (e.g., one or more banana plugs or any other suitable connection type. Further, a side view 440 depicts a side view of the resistance stabilizer 400.

In one aspect, the resistance stabilizer 400 is a stand-alone tool or device. For example, as illustrated the resistance stabilizer 400 can have top view dimensions on the order of a few inches (e.g., 3 inches×3 inches) and somewhat smaller side dimensions (e.g., 2 inches). This is merely an example, and the resistance stabilizer 400 can have any suitable size or dimensions. Further, the switch 414, input 416, and multimeter interfaces 432A-B are merely examples. The resistance stabilizer 400 can have any suitable number of combination of switches and interfaces, and these switches and interfaces can be located on any suitable surface of the resistance stabilizer 400.

Alternatively, or in addition, the resistance stabilizer 400 may be engineered internal to handheld tools, onboard vehicle components, or any other suitable device or component, as hardware or software. For example, the aspects discussed below in relation to FIGS. 5-6 can be engineered internal to a suitable device or component, to provide stabilized resistance. Further, the resistance stabilizer 400 may be integrated with a load tester (e.g., the load tester 100 illustrated above in relation to FIG. 1).

Figure 5:
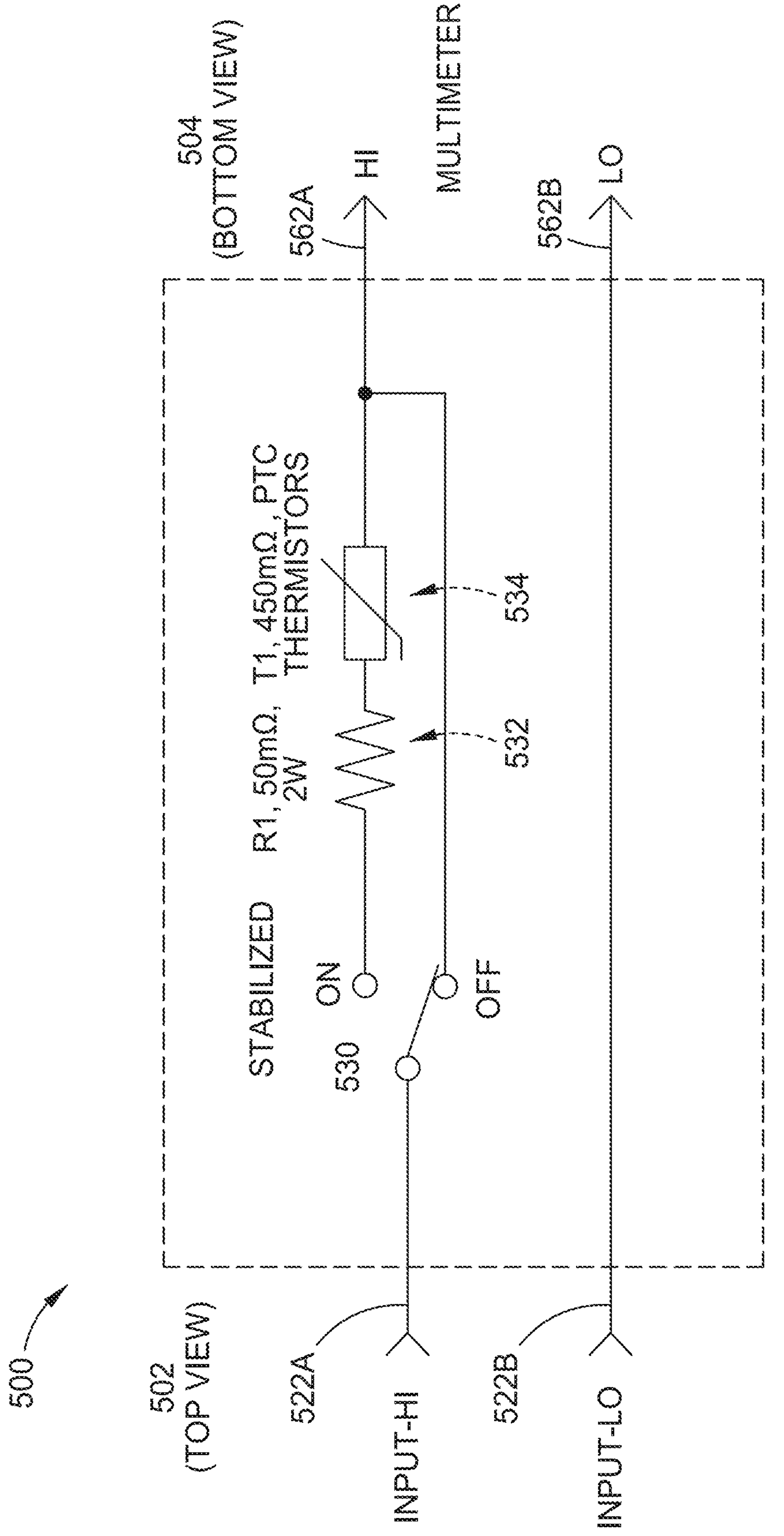
FIG. 5 depicts an example of a resistance stabilizer schematic, according to at least one aspect.

FIG. 5 depicts an example of a resistance stabilizer schematic 500, according to at least one aspect. In an aspect, the schematic 500 corresponds to the resistance stabilizer 400 illustrated in FIG. 4. In an aspect, the resistance stabilizer can be used with a stable signal output (e.g., a 10 mA stable signal output) to provide a fixed current limiting resistance (e.g., of 500 mΩ). The resistance stabilizer provides a stable resistance reference, above a system's (e.g., a vehicle's) EMI noise floor, to uncover electrical degradation of contacts (switch, relay, connectors) and their interface wiring, regardless of wiring length or if the equipment is tested off-wing. For example, when an individual limit switch contact or wire shorter than 10 meters or 32 feet of standard copper wiring is tested using this relative percent method, as discussed above in relation to FIG. 3, the measurement may fluctuate wildly (e.g., with a 20 REL % deviation). When adding the equivalent resistance of 10 meters of vehicle copper wiring, 500 mΩ, the measurement is now stable with less than 1 REL % deviation.

In an aspect, the resistance stabilizer is engineered to automatically limit current draw to ensure operator safety and vehicle component and device protection if inadvertently connected to an energized circuit. A PTC thermistor acts as a resettable fuse, withstanding up to 1000V making the unit CAT IV safe for the user and the equipment. If exceeded, the device opens the circuit, preventing harm or damage, and automatically resets once the power is removed.

In an aspect, the schematic 500 illustrates a top view 502 and a bottom view 504 of one implementation of such a resistance stabilizer. For example, the schematic 500 illustrates two inputs: a high input 522A and a low input 522B (e.g., corresponding to the input 120 illustrated in FIG. 1). An on/off switch 530 (e.g., corresponding to the on/off switch 414 illustrated in FIG. 4) turns load stabilization on or off. For example, the switch 530 selects a signal path with a resistor 532 (e.g., a 50 mΩ 2 W resistor) connected in series to one or more thermistors 534 (e.g., one or more 450 mΩ PCT thermistors).

A DC/AC test switch 230 (e.g., corresponding to the DC/AC test switch 118 illustrated in FIG. 1) allows a user to switch between DC and AC testing. For example, the switches S1 operate to switch between DC and AC testing. One or more thermistors 232 (e.g., one or more T1, 145V, 3.8Ω, 45 MA thermistors) are coupled to transformers 234 (e.g., a 115V AC transformer and 12V AC transformer) to facilitate the switch between DC and AC testing.

Multimeter connection 562A (e.g., a high multimeter connection) and 562B (e.g., a low multimeter connection) provide for connection to a multimeter or another suitable tool or component (e.g., correspond to the multimeter connections 132A and 132B illustrated in FIG. 1). As discussed above, voltage levels are exceeded, the PTC thermistors will immediately open, protecting the user, device and tested equipment.

Figure 6:
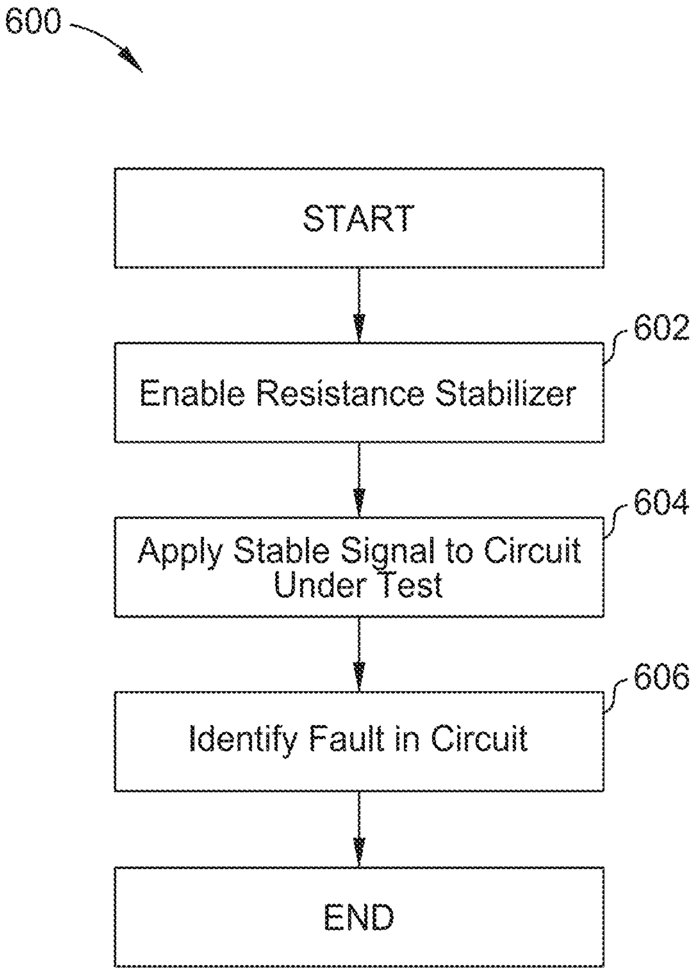
FIG. 6 depicts a flowchart illustrating operation of a resistance stabilizer, according to at least one aspect.

FIG. 6 depicts a flowchart 600 illustrating operation of a resistance stabilizer, according to at least one aspect. At block 602 a resistance stabilizer (e.g., the resistance stabilizer 400 discussed above in relation to FIG. 4 with a schematic 500 as discussed above in relation to FIG. 5) is enabled. For example, a user, automated software service (e.g., the testing service 712 illustrated below in relation to FIG. 7), or any other suitable entity can enable the resistance stabilizer (e.g., using the switch 530 illustrated in FIG. 5).

At block 604, a stable signal is applied to a circuit under test. For example, a stable 10 mA can be output from a suitable component, and can be applied to the circuit under test, along with the fixed current-limiting resistance of the resistance stabilizer (e.g., 500 mΩ).

At block 606, the resistance stabilizer is used to identify a fault in the circuit under test. As noted above, the resistance stabilizer provides a stable resistance reference, above a system's (e.g., the system under test's) EMI noise floor. For example, when a relatively short individual limit switch contact or wire is tested using the relative percent method, as discussed above in relation to FIG. 3, the measurement may fluctuate wildly (e.g., with a 20 REL % deviation). Adding a stable resistance (e.g., the equivalent resistance of 10 meters of vehicle copper wiring, 500 mΩ), the measurement becomes stable with less than 1 REL % deviation and the techniques illustrated in FIG. 3 can be used to identify a fault in a circuit-under test. As noted above, in an aspect the resistance stabilizer is engineered to automatically limit current draw to ensure operator safety and vehicle component and device protection if inadvertently connected to an energized circuit (e.g., using a PTC thermistor as illustrated above in FIG. 5).

Figure 7:
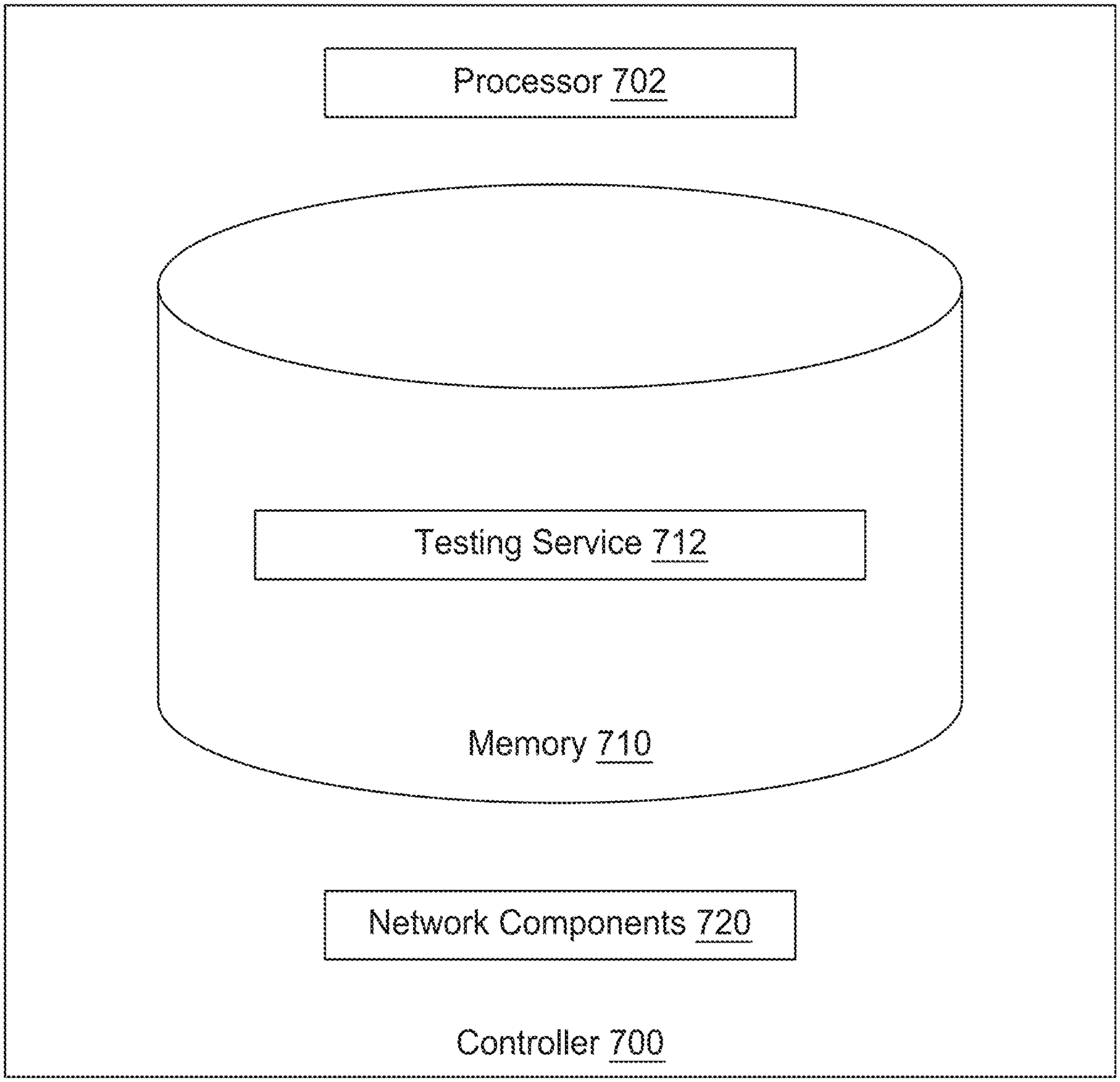
FIG. 7 depicts a block diagram illustrating a controller for detecting electrical degradation in a circuit, according to one aspect.

FIG. 7 is a block diagram illustrating a controller 700 for detecting electrical degradation in a circuit, according to one aspect. In an aspect, the controller 700 can be used a controller for a load tester, as discussed above in relation to FIGS. 1-3, above, or a resistance stabilizer, as discussed above in relation to FIGS. 4-6, above. The controller 700 includes a processor 702, a memory 710, and network components 720. The processor 702 generally retrieves and executes programming instructions stored in the memory 710. The processor 702 is included to be representative of a single central processing unit (CPU), multiple CPUs, a single CPU having multiple processing cores, graphics processing units (GPUs) having multiple execution paths, and the like.

The network components 720 include the components necessary for the controller 700 to interface with components over a network (e.g., other control or testing components). The controller 700 can interface with other elements in a system over a local area network (LAN), for example an enterprise network, a wide area network (WAN), the Internet, or any other suitable network. The network components 720 can include wired, WiFi or cellular network interface components and associated software to facilitate communication between the controller 700 and a communication network.

Although the memory 710 is shown as a single entity, the memory 710 may include one or more memory devices having blocks of memory associated with physical addresses, such as random access memory (RAM), read only memory (ROM), flash memory, or other types of volatile and/or non-volatile memory. The memory 710 generally includes program code for performing various functions related to use of the controller 700. The program code is generally described as various functional "applications" or "services" within the memory 710, although alternate implementations may have different functions and/or combinations of functions. Within the memory 710, a testing service 712 facilitates controlling a load tester, resistance stabilizer, or both, as discussed above in relation to FIGS. 1-6. For example, in one aspect a human user operates a load tester as illustrated in FIG. 3 or a resistance stabilizer as illustrated in FIG. 6. Alternatively, or in addition, the testing service 712 can automatically control some, or all, aspects of the techniques illustrated in FIGS. 3 and 6.

For example, one or more of the load tester or resistance stabilizer illustrated above could be embedded into a system (e.g., a vehicle, including an airplane). The testing service 712, or any other suitable software service, could automatically check for potential faults in the system, using the load tester, resistance stabilizer, or both (e.g., as part of routine or periodic checks). The testing service 712 can provide an alert, and identify the likely faulty component, automatically (e.g., when measured values change over time, or instantaneous comparison of loaded and unloaded circuits identifies a fault).

Although FIG. 7 depicts the generation service 712 as located in the memory 710, that representation is merely provided as an illustration for clarity. More generally, the controller 700 may include one or more computing platforms, such as computer servers for example, which may be co-located, or may form an interactively linked but distributed system, such as a cloud-based system (e.g., a public cloud, a private cloud, a hybrid cloud, or any other suitable cloud-based system). As a result, the processor 702 and memory 710 may correspond to distributed processor and memory resources within a computing environment.

In the current disclosure, reference is made to various aspects. However, it should be understood that the present disclosure is not limited to specific described aspects. Instead, any combination of the following features and elements, whether related to different aspects or not, is contemplated to implement and practice the teachings provided herein. Additionally, when elements of the aspects are described in the form of "at least one of A and B," it will be understood that aspects including element A exclusively, including element B exclusively, and including element A and B are each contemplated. Furthermore, although some aspects may achieve advantages over other possible solutions and/or over the prior art, whether or not a particular advantage is achieved by a given aspect is not limiting of the present disclosure. Thus, the aspects, features, aspects and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects described herein may be embodied as a system, method or computer program product. Accordingly, aspects may take the form of an entirely hardware aspect, an entirely software aspect (including firmware, resident software, micro-code, etc.) or an aspect combining software and hardware aspects that may all generally be referred to herein as a "circuit," "module" or "system." Furthermore, aspects described herein may take the form of a computer program product embodied in one or more computer readable storage medium(s) having computer readable program code embodied thereon.

Program code embodied on a computer readable storage medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to aspects of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various aspects of the present disclosure. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A method, comprising:

measuring one or both of a first voltage drop or a first resistance, across a first circuit, using a load tester providing a first load greater than zero;

measuring one or both of a second voltage drop or a second resistance, across the first circuit, using the load tester providing no load;

determining one or both of: (i) a difference between the first voltage drop and the second voltage drop, or (ii) a difference between the first resistance and the second resistance, exceeds a pre-determined threshold value; and based on the determining, identifying a fault in the first circuit.

2. The method of claim 1, wherein the first load is greater than 1 mA and less than 1 A.

3. The method of claim 1, wherein the pre-determined threshold value comprises a relative percent change between one or both of: (i) the difference between the first voltage drop and the second voltage drop, or (ii) the difference between the first resistance and the second resistance.

4. The method of claim 3, wherein the relative percent change comprises a relative percent change between 0% and 25%.

5. The method of claim 4, wherein the load tester comprises a resistor in series with a positive temperature coefficient (PTC) thermistor.

6. The method of claim 5, wherein the load tester is configured to provide the first load for a plurality of voltages, and wherein each of the plurality of voltages is associated with a respective path in the load tester.

7. The method of claim 3, wherein the load tester is integrated into a multimeter device.

8. The method of claim 1, further comprising identifying a component of the circuit causing the fault using a time domain reflectometer (TDR).

9. The method of claim 1, further comprising providing a stable resistance to the circuit using a resistance stabilizer.

10. The method of claim 9, wherein the resistance stabilizer comprises a resistor in series with a PTC thermistor.

11. A load tester device, comprising:

an input for a circuit under test;

a load selector configured to switch between providing a load and providing no load to the circuit under test;

an output for measuring a voltage drop across the circuit under test and a resistance across the circuit under test; and a first circuit path including a resistor in series with a positive temperature coefficient (PTC) thermistor configured to measure the voltage drop across the circuit under test and the resistance across the circuit under test both when providing a first load to the circuit under test and when providing no load to the circuit under test, using a circuit path including the resistor in series with the PTC thermistor.

12. The load tester device of claim 11, further configured to provide the first load for a plurality of voltages, and wherein each of the plurality of voltages is associated with a respective path in the load tester device.

13. The load tester device of claim 11, wherein the load tester device is integrated into a multimeter device.

14. The load tester device of claim 11, wherein the load tester device further comprises a second circuit path providing a stable resistance to the circuit under test, using a resistance stabilizer.

15. The load tester device of claim 14, wherein the second circuit path providing the stable resistance to the circuit under test comprises a second resistor in series with a second one or more PTC thermistors.

16. The load tester device of claim 11, wherein the load tester device is configured to determine one or both of (i) a difference between a first voltage drop for the circuit under test, and a second voltage drop for the circuit under test, or (ii) a difference between a first resistance for the circuit under test, and a second resistance for the circuit under test exceeds a pre-determined threshold value, wherein the pre-determined threshold value comprises a relative percent change between one or both of the difference between the first voltage drop for the circuit under test and the second voltage drop for the circuit under test, or the difference between the first resistance for the circuit under test and the second resistance for the circuit under test.

17. A method, comprising:

applying a stable signal to a circuit under test;

providing a stable resistance to the circuit under test using a resistance stabilizer; and identifying a fault in the circuit under test, wherein said identifying comprises determining one or both of (i) a difference between a first voltage drop for the circuit under test, measured using a load tester, and a second voltage drop for the circuit under test, measured using the load tester, or (ii) a difference between a first resistance for the circuit under test, measured using the load tester, and a second resistance for the circuit under test measured, using the load tester, exceeds a pre-determined threshold value, wherein the pre-determined threshold value comprises a relative percent change between one or both of the difference between the first voltage drop for the circuit under test and the second voltage drop for the circuit under test, or the difference between the first resistance for the circuit under test and the second resistance for the circuit under test.

18. The method of claim 17, wherein the resistance stabilizer provides the stable resistance using a path comprising a resistor in series with a positive temperature coefficient (PTC) thermistor.

19. The method of claim 17, wherein the relative percent change comprises a relative percent change between 0% and 25%.

20. The method of claim 17, wherein the load tester comprises a resistor in series with a PTC thermistor.

* * * * *